(12) United States Patent
Jang et al.

(10) Patent No.: US 12,154,923 B2
(45) Date of Patent: *Nov. 26, 2024

(54) IMAGING DEVICE INCLUDING SHARED PIXELS AND OPERATING METHOD THEREOF

(71) Applicant: SAMSUNG ELECTRONICS CO., LTD., Suwon-si (KR)

(72) Inventors: Chanyoung Jang, Pohang-si (KR); Hee Kang, Hwaseong-si (KR); Minkyu Sun, Suwon-si (KR); Youngjun Song, Seoul (KR); Wooseok Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/297,220

(22) Filed: Apr. 7, 2023

(65) Prior Publication Data

US 2023/0246051 A1 Aug. 3, 2023

Related U.S. Application Data

(63) Continuation of application No. 17/038,765, filed on Sep. 30, 2020, now Pat. No. 11,646,338.

(30) Foreign Application Priority Data

Jan. 23, 2020 (KR) .................. 10-2020-0009399

(51) Int. Cl.
*H01L 27/146* (2006.01)
*H04N 23/67* (2023.01)
(Continued)

(52) U.S. Cl.
CPC .. *H01L 27/14627* (2013.01); *H01L 27/14629* (2013.01); *H04N 23/672* (2023.01);
(Continued)

(58) Field of Classification Search
CPC ......... H01L 27/14627; H01L 27/14629; H01L 27/14641; H01L 27/14603; H04N 23/672;
(Continued)

(56) References Cited

U.S. PATENT DOCUMENTS 8,902,321 B2 12/2014 Venkataraman et al.
9,179,113 B2 11/2015 Tachi
(Continued)

FOREIGN PATENT DOCUMENTS

CN 108933907 A 12/2018
IN 201917015317 7/2019
(Continued)

OTHER PUBLICATIONS

Office Action dated Jan. 15, 2024 in Chinese Patent Application No. 202110015534.1, in Chinese, 7 pages.
(Continued)

*Primary Examiner* — Shahbaz Nazrul
(74) *Attorney, Agent, or Firm* — F. CHAU & ASSOCIATES, LLC

(57) ABSTRACT

An operating method of an imaging device comprising a plurality of shared pixels that share a floating diffusion node and each comprising sub-pixels covered by a micro-lens. The method involves generating a capture image from the plurality of shared pixels that receive light reflected from an object; compensating for the capture image using static phase information based on misalignment of the micro lens of each of the plurality of shared pixels; performing auto exposure control based on the compensation of the capture image; performing auto focus control based on the compen-
(Continued)

sated capture image; and generating an output image by processing the compensated capture image.

20 Claims, 20 Drawing Sheets

(51) Int. Cl.
  *H04N 23/73* (2023.01)
  *H04N 25/589* (2023.01)
  *H04N 25/771* (2023.01)
(52) U.S. Cl.
  CPC ........... *H04N 23/73* (2023.01); *H04N 25/589* (2023.01); *H04N 25/771* (2023.01)
(58) Field of Classification Search
  CPC .... H04N 23/73; H04N 25/589; H04N 25/771; H04N 23/72; H04N 23/959; H04N 25/585; H04N 25/671; H04N 23/55; H04N 25/40; H04N 23/67; H04N 23/76; H04N 23/80; H04N 23/81; H04N 25/58
  See application file for complete search history.

(56) References Cited

U.S. PATENT DOCUMENTS

| | | | |
|---|---|---|---|
| 9,729,806 B2 | 8/2017 | Fettig et al. | |
| 9,888,198 B2 | 2/2018 | Mauritzson et al. | |
| 10,015,428 B2 | 7/2018 | Lee et al. | |
| 10,044,959 B2 | 8/2018 | Galor Gluskin | |
| 10,104,324 B2 | 10/2018 | Hirota | |
| 10,110,840 B2 * | 10/2018 | Velichko | H04N 25/531 |
| 10,270,988 B2 | 4/2019 | Li | |
| 10,341,620 B2 | 7/2019 | Murata | |
| 10,547,800 B2 | 1/2020 | Hwang et al. | |
| 10,620,116 B2 | 4/2020 | Kojima et al. | |
| 2010/0045849 A1 | 2/2010 | Yamasaki | |
| 2013/0076966 A1 | 3/2013 | Border et al. | |
| 2014/0307100 A1 | 10/2014 | Myllykoski et al. | |
| 2016/0255289 A1 | 9/2016 | Johnson et al. | |
| 2017/0171470 A1 * | 6/2017 | Sakioka | H04N 25/135 |
| 2018/0292310 A1 * | 10/2018 | Kojima | A61B 1/0646 |
| 2018/0367747 A1 | 12/2018 | Mo et al. | |
| 2020/0242488 A1 | 7/2020 | Medas et al. | |
| 2020/0260055 A1 * | 8/2020 | Choi | H04N 23/84 |
| 2021/0233950 A1 | 7/2021 | Jang et al. | |

FOREIGN PATENT DOCUMENTS

| | | |
|---|---|---|
| JP | 2016-052041 A2 | 4/2016 |
| JP | 2018-019296 | 2/2018 |
| SG | 166239 | 12/2010 |
| WO | WO2009070670 A1 | 6/2009 |
| WO | WO2016035566 A1 | 3/2016 |
| WO | WO2017099253 A1 | 6/2017 |
| WO | WO2019070299 A1 | 4/2019 |

OTHER PUBLICATIONS

"A Vision" of the future—FSI and BSI Image Sensory Technology; Aptina Imaging Corporation; Display and Optical Devices; With English Language Conclusion, 5 pages.

Office Action dated Aug. 22, 2024 in corresponding Korean Patent Application No. 10-2020-0009399 (9 pages), in Korean.

* cited by examiner

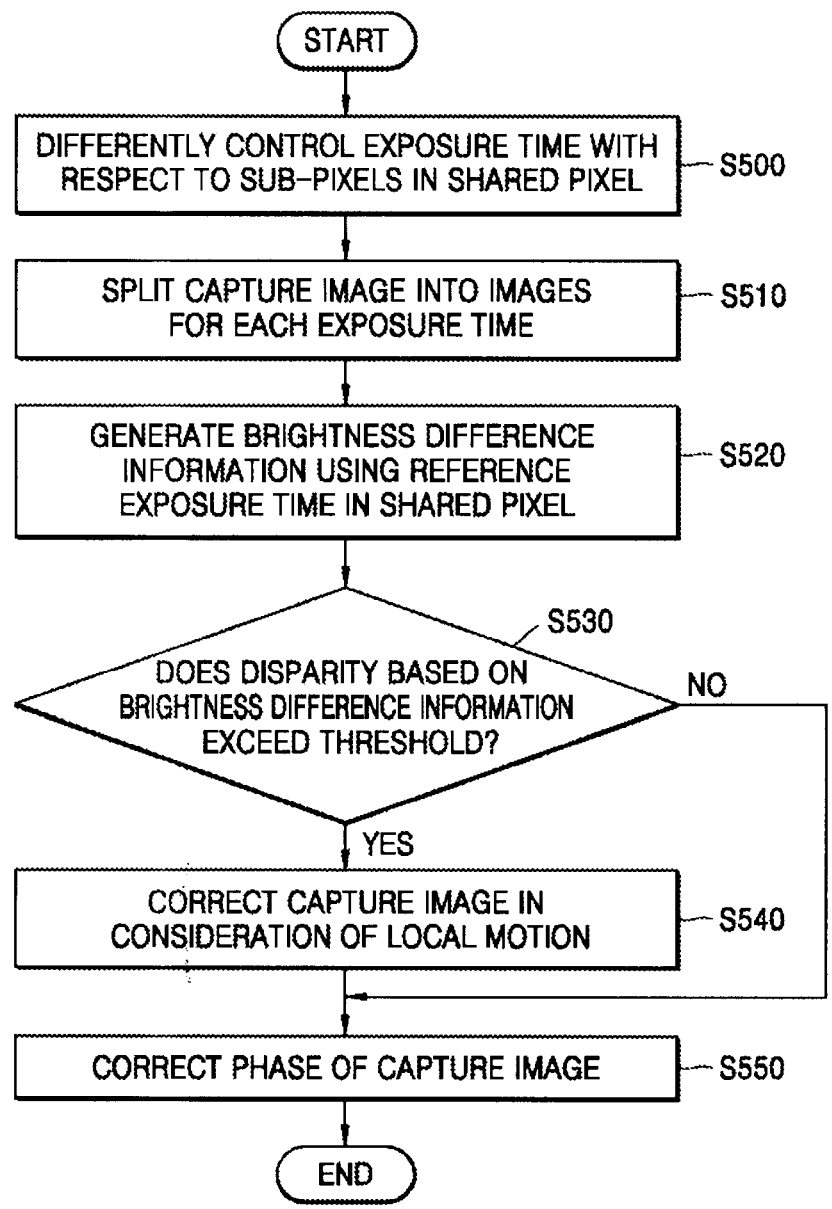

IMAGING DEVICE INCLUDING SHARED PIXELS AND OPERATING METHOD THEREOF

CROSS-REFERENCE TO RELATED APPLICATIONS

This application is a continuation under 35 U.S.C. 120 of U.S. application Ser. No. 17/038,765, filed on Sep. 30, 2020 in the United States Patent and Trademark Office, which claims the benefit of Korean Patent Application No. 10-2020-0009399, filed on Jan. 23, 2020, in the Korean Intellectual Property Office, the disclosures of which are incorporated herein by reference in their entireties.

TECHNICAL FIELD

This disclosure relates generally to an imaging device, and more particularly, to an imaging device including shared pixels and an operating method thereof.

DISCUSSION OF THE RELATED ART

Imaging devices that obtain and convert images into electrical signals have seen expanded use in a wide variety of consumer electronics such as digital cameras, cameras for mobile phones, and portable camcorders, as well as in cameras mounted in automobiles, security devices, robots, and so forth. Such imaging devices include a pixel array, where each pixel in the pixel array may include a photosensitive element. The photosensitive element may generate an electrical signal according to the intensity of absorbed light incident upon it.

A structure for a shared pixel including a plurality of sub-pixels sharing a floating diffusion node has been proposed to improve an auto-focus function and increase dynamic range of the imaging device. Research to improve the performance of such shared pixel imaging devices is ongoing.

SUMMARY

Embodiments of the inventive concept provide an imaging device and operating method thereof that generate a high-resolution image and simultaneously perform an improved auto-focus operation.

According to an aspect of the inventive concept, there is provided an operating method of an imaging device including a plurality of shared pixels that share a floating diffusion node and each shared pixel includes sub-pixels covered by a micro-lens. In the method, a capture image is generated from the plurality of shared pixels that receive light reflected from an object. The capture image is compensated using static phase information based on misalignment of the micro lens of each of the plurality of shared pixels. Auto exposure control is performed based on the compensation of the capture image. Auto focus control is performed based on the compensated capture image; and an output image is generated by processing the compensated capture image.

According to another aspect of the inventive concept, there is provided an imaging device including a pixel array including a plurality of shared pixels that share a floating diffusion node, each shared pixel includes sub-pixels covered by a micro-lens, and receives light reflected from an object. A memory stores static phase information based on misalignment of the micro lens of each of the plurality of shared pixels. Processing circuitry is configured to compensate for a capture image generated from the plurality of shared pixels using the static phase information and generate the compensated capture image; and a controller is configured to perform auto exposure control based on a compensation degree of the capture image and perform auto focus control using the compensated capture image.

According to another aspect of the inventive concept, there is provided an operating method of an imaging device including a plurality of shared pixels that share a floating diffusion node and each includes sub-pixels covered by one micro-lens, including generating a capture image from the plurality of shared pixels that receive light reflected from an object; compensating for the capture image using static phase information based on a degree of misalignment of the micro lens of each of the plurality of shared pixels; and processing the compensated capture image based on an operation mode.

BRIEF DESCRIPTION OF THE DRAWINGS

Embodiments of the inventive concept will be more clearly understood from the following detailed description taken in conjunction with the accompanying drawings in which:

FIG. 11 is a flowchart illustrating an operating method of an imaging device in an HDR mode according to an embodiment of the inventive concept;

DETAILED DESCRIPTION OF EMBODIMENTS

Hereinafter, embodiments of the inventive concept will be described in detail with reference to the accompanying drawings.

Figure 1:
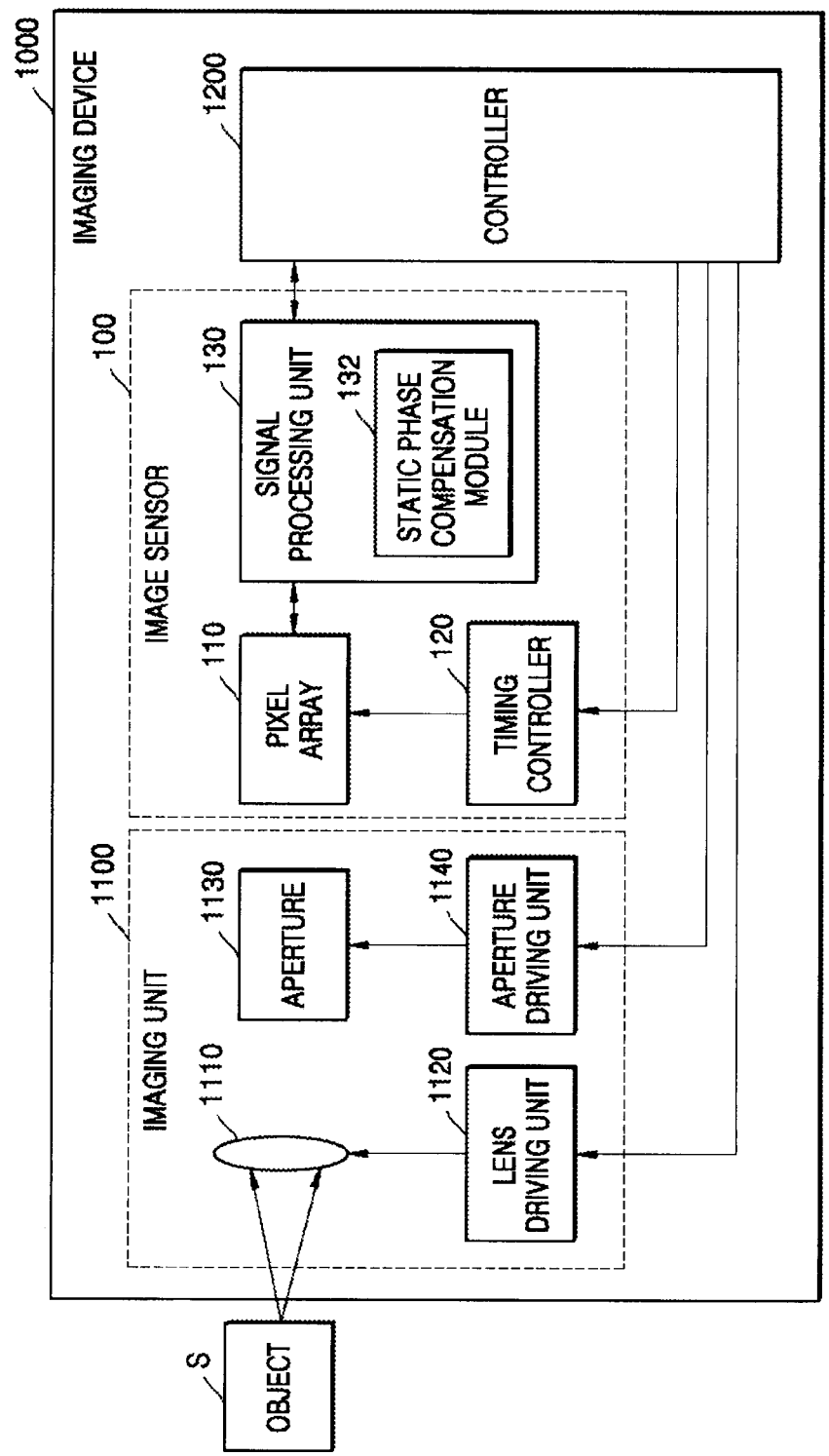
FIG. 1 is a diagram illustrating an example of a structure of an imaging device according to an embodiment of the inventive concept, wherein the imaging device performs an auto-focus function and an auto-exposure function.

FIG. 1 is a diagram illustrating an example of a structure of an imaging device 1000 according to an embodiment of the inventive concept, where the imaging device 1000 performs an auto-focus function and an auto-exposure function. The imaging device 1000 may include an imaging unit 1100, an image sensor 100, and a controller 1200.

The imaging unit 1100 is a component that receives light, and may include a lens 1110, a lens driving unit 1120, an aperture 1130, and an aperture driving unit 1140. The lens 1110 may include a plurality of lenses. The image sensor 100 may convert incident light into an image signal. The image sensor 100 may include a pixel array 110, a timing controller 120, and a signal processing unit 130. An optical signal penetrating the lens 1110 and the aperture 1130 may reach the light-receiving surface of the pixel array 110 to form an image of an object S.

The controller 1200 may control an overall operation of the imaging device 1000. To this end, the controller 1200 may provide control signals for the operation of each component, such as the lens driving unit 1120, the aperture driving unit 1140, the timing controller 120, and the like.

The lens driving unit 1120 may communicate information about focus detection with the controller 1200 and may adjust the position of the lens 1110, according to a control signal provided from the controller 1200. The controller 1200 may generate the information about focus detection, described in detail later. The lens driving unit 1120 may move the lens 1110 in a direction in which its distance to the object S increases or decreases. Thus, the distance between the lens 1110 and the object S may be adjusted. The object S may be focused or blurred depending on the position of the lens 1110.

For example, when the distance between the lens 1110 and the object S is relatively close, the position of the lens 1110 may deviate from an in-focus position for focusing the object S and a phase difference may occur between images generated from the image sensor 100. In this case, the lens driving unit 1120 may move the lens 1110 inwardly to increase the distance to the object S, based on the control signal provided from the controller 1200.

On the other hand, when the distance between the lens 1110 and the object S is relatively far, the lens 1110 may deviate from the in-focus position and the phase difference may occur between images generated from the image sensor 100. In this scenario the lens driving unit 1120 may move the lens 1110 outwardly to decrease the distance to the object S, based on the control signal provided from the controller 1200.

The pixel array 110 may be a complementary metal oxide semiconductor image sensor (CIS) that converts the optical signal into an electrical signal. The pixel array 110 may include a plurality of shared pixels. A shared pixel shares a floating diffusion node and includes a plurality of sub-pixels covered by one micro lens. Descriptions of the shared pixel are given later with respect to FIG. 2B, etc. The pixel array 110 may be adjusted by the timing controller 120 in an exposure time, sensitivity, etc. with respect to the shared pixel. According to an embodiment of the inventive concept, the exposure time with respect to the shared pixel may be controlled differently according to an operation mode of the imaging device 1000. For example, the imaging device 1000 may operate in a normal mode or a high dynamic range (HDR) mode, and an exposure time with respect to sub-pixels of the shared pixel may be controlled differently in these two modes, respectively.

The signal processing unit 130 according to an embodiment of the inventive concept may include a static phase compensation module 132. Shared pixels of pixel array 110 each have a structure in which a plurality of sub-pixels are covered by one micro lens. In an actual process, because it is difficult for the micro lens to be consistently disposed in each shared pixel in an ideal position, the shared pixel may be misaligned with the micro lens and the misalignment of micro lenses of each of the shared pixels may be different. (Herein, "misalignment" may be understood as a "degree of misalignment". A degree of misalignment may refer to a direction and/or a magnitude of misalignment of an orientation angle, that differs from an expected orientation.) The signal processing unit 130 may compensate for a capture image received from the pixel array 110 considering different degrees of misalignment of the shared pixels through a static phase compensation module 132. As an embodiment, the signal processing unit 130 may compensate for the capture image using static phase information based on the degree of misalignment of the micro lenses of each of the shared pixels of the pixel array 110.

Moreover, the static phase information may correspond to information about a default phase difference between pixel images of each of the shared pixels due to the degree of misalignment between each of the shared pixels and different micro lenses. As an embodiment, the static phase information may include a compensation gain for each shared pixel based on a comparison result by comparing a sample image generated by radiating plane light to the shared pixels of the pixel array 110 and a reference image. The reference image may correspond to image information that is expected to be generated when the micro lens is aligned and arranged in each of the shared pixels, and the compensation gain for each shared pixel may correspond to a gain applied to each of the pixel images output from each of the shared pixels. The pixel images of each of the shared pixels may form a capture image.

As an embodiment, the signal processing unit 130 may adaptively perform processing on the capture image received from the pixel array 110 according to the operation mode of the imaging device 1000. First, when the imaging device 1000 operates in the normal mode, the signal processing unit 130 may detect a dynamic phase generated by the distance between the object S and the imaging device 1000 and correct the capture image based on the detected dynamic phase. In the normal mode, exposure times with respect to a plurality of sub-pixels in one shared pixel of the pixel array 110 may be controlled to be the same. A specific embodiment in this regard will be described with respect to FIG. 9 and the like.

When the imaging device 1000 operates in the HDR mode, the exposure times with respect to the plurality of sub-pixels in one shared pixel of the pixel array 110 may be controlled to have at least two exposure times (interchangeably, "patterns"). For example, if the sub-pixels are configured as 2×2, such that when the sub-pixels include first to fourth sub-pixels, the first sub-pixel has a long exposure time, the second sub-pixel has a short exposure time, and the third and the fourth sub-pixels have an intermediate exposure time.

The signal processing unit 130 may split capture images for each exposure time and compare brightness of a split image corresponding to the reference pattern among patterns to a reference brightness to generate brightness difference information. The signal processing unit 130 may correct the compensated capture image based on the brightness difference information. A detailed embodiment in this regard will be described later with respect to FIG. 12 and the like.

The signal processing unit 130 may perform various operations such as color interpolation, color correction, auto white balance, gamma correction, color saturation correction, format correction, bad pixel correction, hue correction, etc. on the capture image to generate an output image.

The controller 1200 may perform automatic exposure control based on the compensated or corrected capture image received from the signal processing unit 130. Moreover, as a result of the compensation operation on the capture image by the signal processing unit 130, because the entire image brightness may be brighter than before, it is necessary to perform automatic exposure control considering this. Accordingly, the controller 1200 may perform automatic exposure control based on the degree of image brightness change according to compensation based on the static phase information of the capture image. The controller 1200 may control at least one of the aperture 1130, the timing controller 120, and a shutter (not shown) speed for automatic exposure control. For example, the controller 1200 may control the exposure time to be shorter than before considering the compensation operation on the capture image.

The controller 1200 may perform auto focus control based on the compensated or corrected capture image received from the signal processing unit 130. The controller 1200 may perform a phase difference calculation on the capture image received from the signal processing unit 130 and may obtain the position of a focus, the direction of the focus, or the distance between the object S and the imaging device 1000 (or the image sensor 100), etc. as a result of the phase difference calculation. The controller 1200 may output a control signal to the lens driving unit 1120 to move the position of the lens 1110 based on the result of the phase difference calculation.

The imaging apparatus 1000 according to an embodiment of the inventive concept may compensate for the capture image considering misalignment of the micro lens of each of the shared pixels and a phase difference caused by a difference in the degree of misalignment, and correct adaptively the capture image according to an operation mode, thereby generating an image with good image quality and simultaneously providing an improved auto focus function.

Figure 2A:
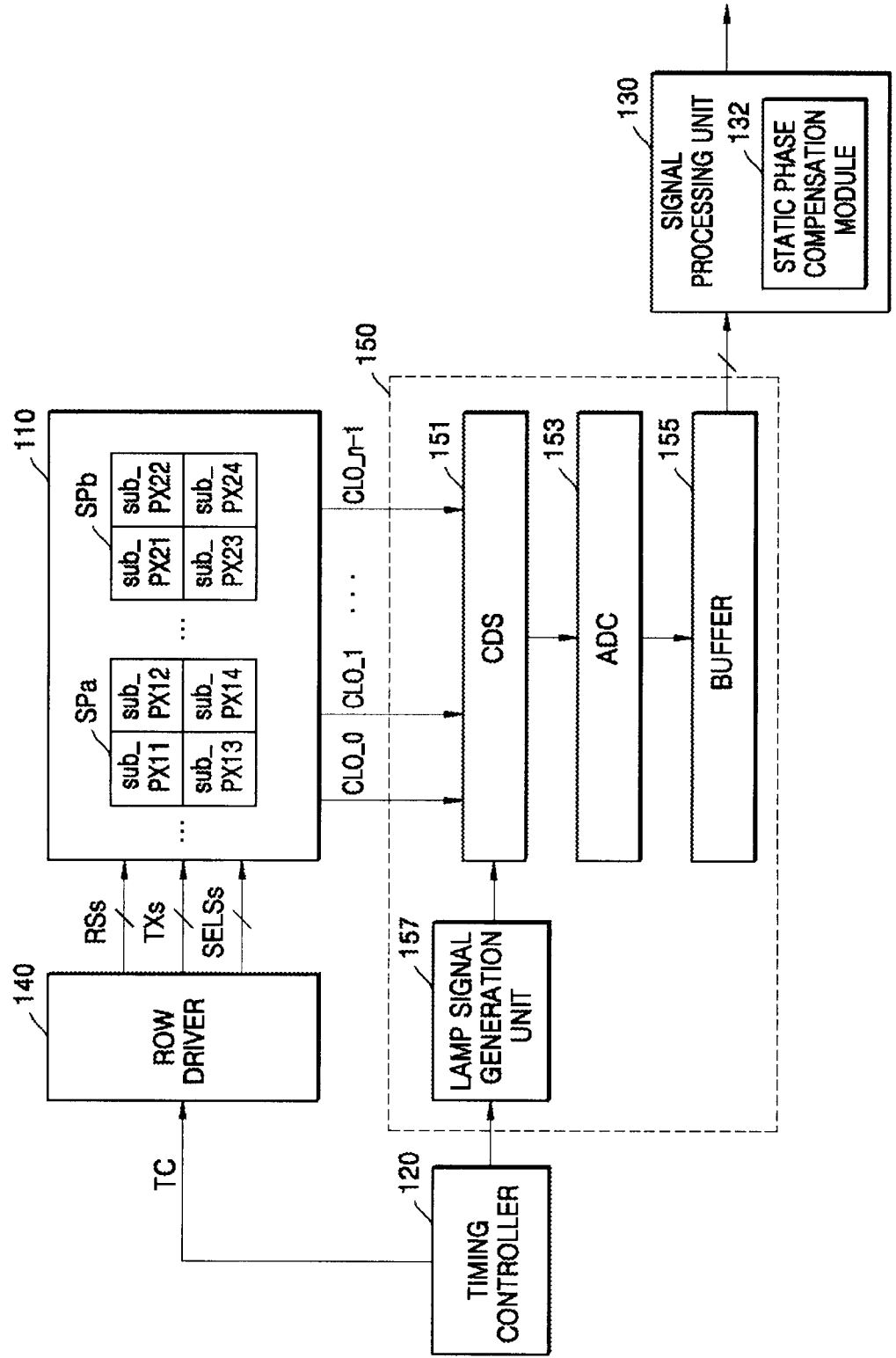
FIG. 2A is a block diagram illustrating a configuration of an image sensor according to an embodiment of the inventive concept.
Figure 2B:
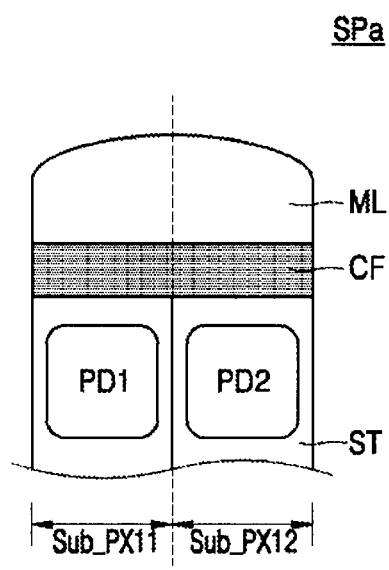
FIGS. 2B, 2C and 2D are diagrams illustrating shared pixels.
Figure 2C:
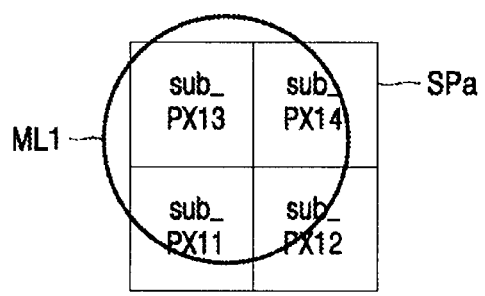
Figure 2D:
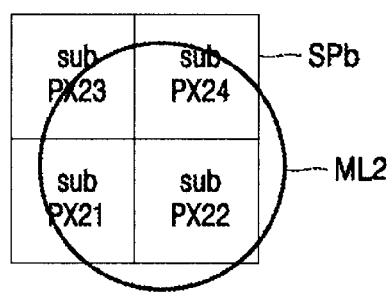

FIG. 2A is a block diagram illustrating a configuration of the image sensor 100 according to an embodiment of the inventive concept, and FIGS. 2B to 2D are diagrams illustrating shared pixels SPa and SPb.

Referring to FIGS. 1 and 2A, the image sensor 100 may include the pixel array 110, the timing controller 120, the signal processing unit 130, a row driver 140, and a signal reading unit 150.

The pixel array 110 may be formed in units of pixels, and may include the plurality of shared pixels SPa and SPb. The shared pixels SPa and SPb may include a plurality of sub-pixels sub_PX11 to sub_PX14 and sub_PX21 to sub_PX24, respectively. The sub-pixels sub_PX11 to sub_PX14 and sub_PX21 to sub_PX24 may each include a photosensitive element. For example, the photosensitive element may include a photodiode. The shared pixels SPa and SPb may absorb light to generate charges, and an electrical signal according to the generated charges may be provided to the signal reading unit 150. The signal reading unit 150 may include correlated double sampling (CDS) circuitry 151, analog to digital (ADC) circuitry 153, a buffer 155, and lamp signal generation circuitry (unit) 157. The controller 120 may apply timing signals to the signal reading unit 150 to control readout of grayscale voltages from the pixel array 110.

FIG. 2B illustrates the shared pixel SPa of FIG. 1 viewed from one side. As shown in FIG. 2B, the shared pixel SPa may include the first and second sub-pixels sub_PX11 and sub_PX12, and a first photodiode PD1 of the first sub-pixel sub_PX11 and a second photodiode PD2 of the second sub-pixel sub_PX12 may be disposed on a substrate ST. A predetermined color filter CF (for example, one of red, green, and blue color filters) may be disposed on the substrate ST. The first and second sub pixels sub_PX11 and sub_PX12 may be covered by one micro lens ML, which may be referred to as a shared micro lens ML.

Moreover, referring further to FIG. 2C, a first micro lens ML1 may be biased in a first direction to cover the first shared pixel SPa due to various factors in the process in the first micro-pixel ML1. In addition, referring further to FIG. 2D, a second micro lens ML2 may be biased in a second, different direction to cover the second shared pixel SPb due to various factors in the process in the second shared pixel SPb.

Because the misalignment between the first shared pixel SPa and the first micro lens ML1 and the misalignment between the second shared pixel SPb and the second micro lens ML2 are different, there is a problem that the image quality may deteriorate due to a phase difference between pixel images caused by the difference. Therefore, the signal processing unit 130 according to the embodiment of the inventive concept may compensate for a capture image from the pixel array 110 including the first and second shared pixels SPa and SPb through the static phase compensation module 132 considering phase differences such as that described above. The signal processing unit 130 may perform various processing operations according to an operation mode on the compensated capture image, and as a result, may generate an output image having good image quality.

Figure 3:
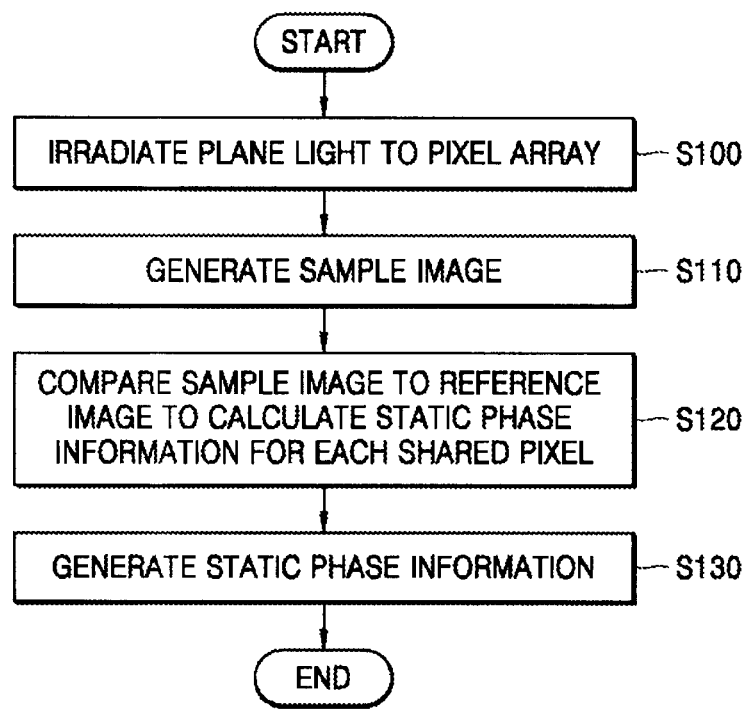
FIG. 3 is a diagram illustrating a method of generating static phase information, according to an embodiment of the inventive concept.

FIG. 3 is a diagram illustrating a method of generating static phase information according to an embodiment of the inventive concept.

Referring to FIG. 3, in operation S100, plane light may be irradiated to a pixel array including a plurality of shared pixels. In operation S100, a sample image may be generated through shared pixels. The sample image is generated from an optical signal received by the shared pixels from the plane light and may correspond to a signal for checking the misalignment of each of the shared pixels with a micro lens. In operation S120, the sample image and a reference image may be compared to calculate the static phase information for each shared pixel. The reference image may be preset as a signal that is expected to be generated through the planar light when the micro lens of each of the shared pixels is aligned. As described above, the static phase information may include a compensation gain for each shared pixel. In operation S130, the static phase information calculated in operation S120 may be previously stored in a memory of an imaging device, and in the future, a compensation operation may be performed on a capture image by applying the compensation gain for each shared pixel to pixel images generated from the shared pixels.

Figure 4:
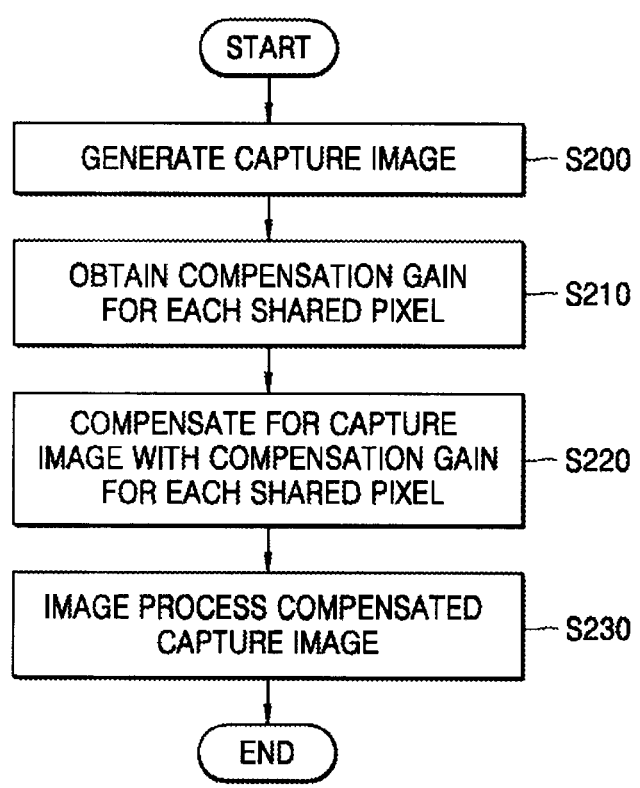
FIG. 4 is a flowchart illustrating a compensation operation on a capture image according to an embodiment of the inventive concept.

FIG. 4 is a flowchart illustrating a compensation operation on a capture image according to an embodiment of the inventive concept.

Referring to FIG. 4, in operation S200, an imaging device may generate the capture image using a plurality of shared pixels of a pixel array. In operation S210, the imaging device may access a memory to obtain a compensation gain for each previously stored shared pixel. In operation S220, the imaging device may compensate for the capture image with a compensation gain for each shared pixel. In operation S230, the imaging device may adaptively process the compensated capture image according to an operation mode.

Figure 5:
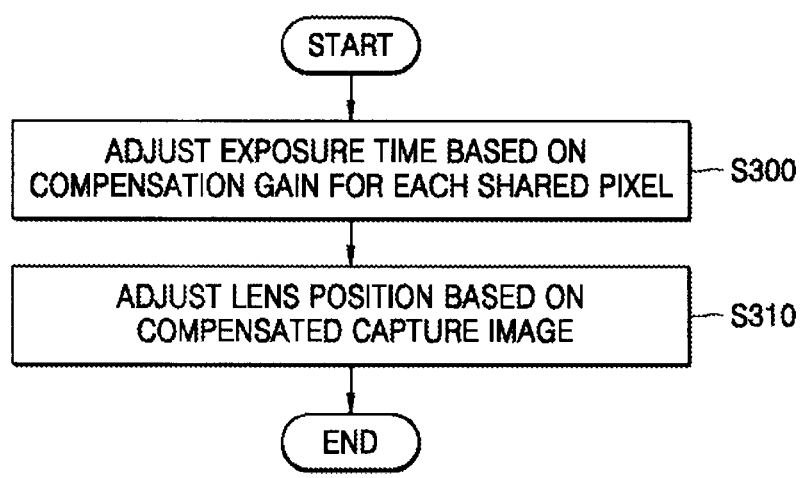
FIG. 5 is a flowchart illustrating an auto exposure control and auto focus control method according to an embodiment of the inventive concept.

FIG. 5 is a flowchart illustrating an auto exposure control and auto focus control method according to an embodiment of the inventive concept.

Referring to FIG. 5, in operation S300, an imaging device may perform automatic exposure control, and as part of such an operation, may adjust an exposure time based on a compensation gain for each shared pixel. That is, as the compensation gain for each shared pixel is applied to a capture image, the brightness of the compensated capture image may increase, and thus, the imaging device may adjust the exposure time of the shared pixel to be reduced considering the compensation gain for each shared pixel, to adjust the brightness of a final output image. In operation S310, the imaging device may perform auto focus control, and as part of such an operation, may adjust a lens position based on the compensated capture image. For instance, the imaging device may calculate a phase difference between pixel images corresponding to respective shared pixels included in the compensated capture image to adjust the position of a lens.

Figure 6A:
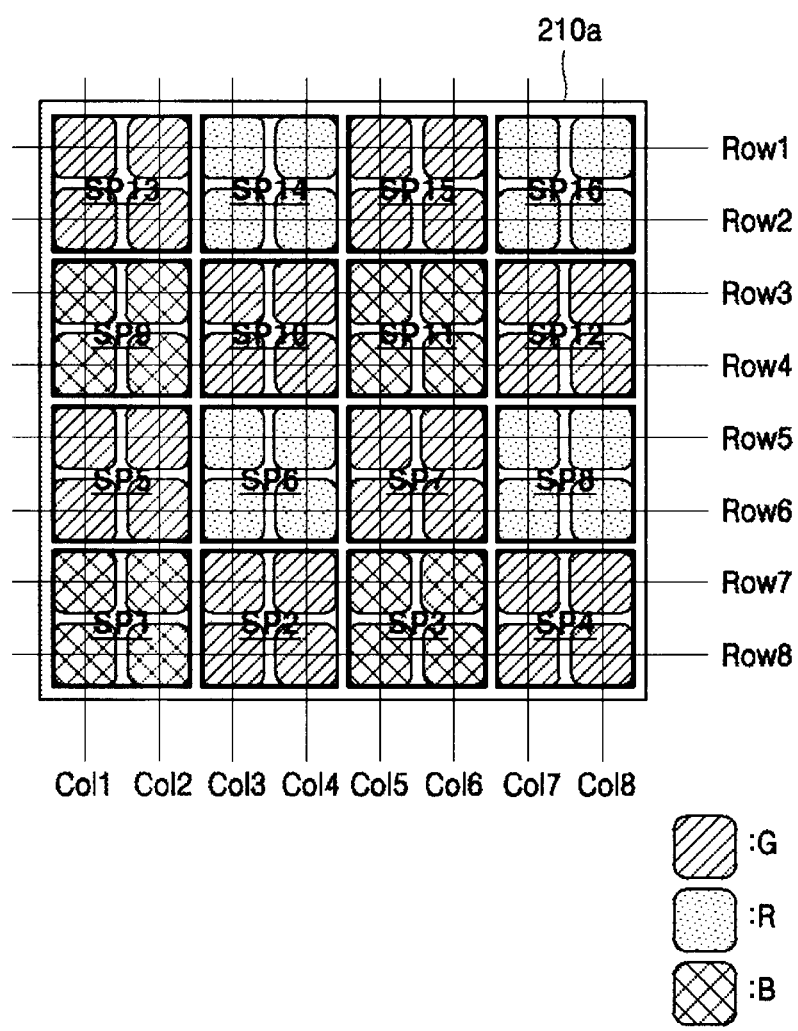
FIGS. 6A, 6B and 6C are diagrams illustrating implementation examples of a pixel array according to an embodiment of the inventive concept.
Figure 6B:
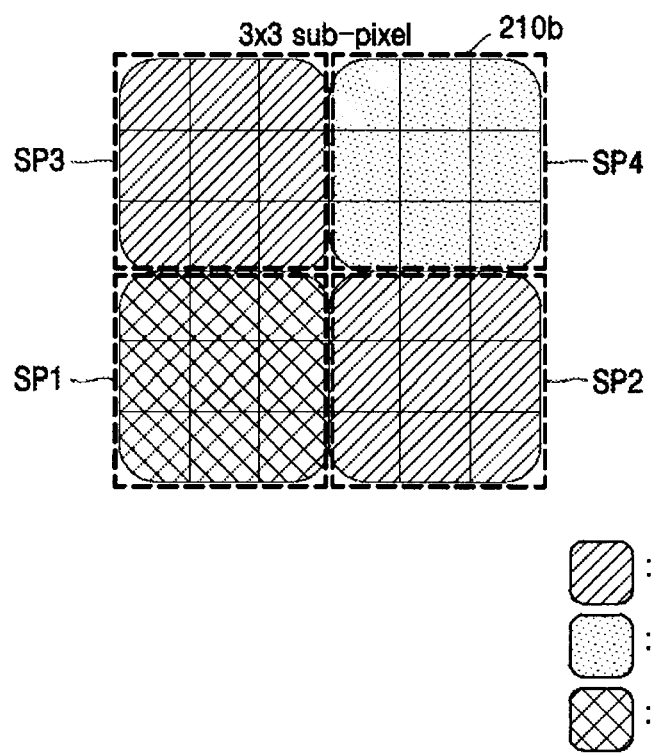
Figure 6C:
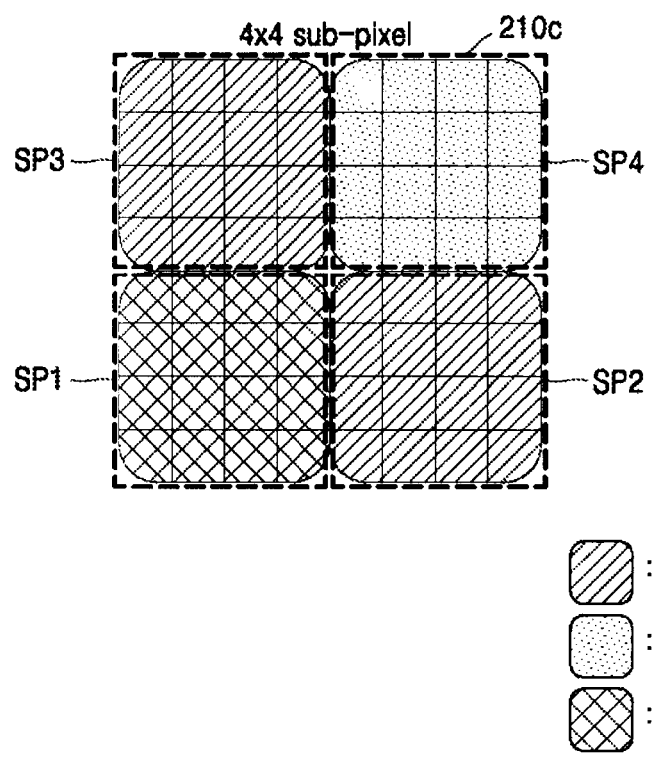

FIGS. 6A to 6C are diagrams illustrating implementation examples of a pixel array block according to respective embodiments of the inventive concept. Referring to FIG. 6A, a pixel array block 210a may include a plurality of shared pixels. In a typical embodiment, the pixel array 110 may include hundreds, thousands or over a million shared pixels. A shared pixel with a 2×2 sub-pixel block (four sub-pixels) is defined as a unit including sub-pixels disposed in two rows and two columns. In this case, the shared pixel may include four photodiodes respectively corresponding to four sub-pixels. The four photodiodes in the shared pixel may share a floating diffusion node (not shown). The example of FIG. 6A shows the pixel array block 210a including first to 16$^{th}$ shared pixels SP1 to SP16. The shared pixels SP1 to SP16 may each include a color filter to allow a particular color to be sensed, e.g., red (R), green (G) or blue (B) by filtering out wavelengths outside that of the particular color. Each of the first to 16$^{th}$ shared pixels SP1 to SP16 may include sub-pixels having the same color filters arranged thereon.

In the following discussion, for brevity, an "i$^{th}$ shared pixel SPi" may be referred to as just "SPi" or just "pixel SPi", where i is any integer. For example, in FIG. 6A, the pixels SP1, SP3, SP9 and SP11 may include sub-pixels having the B color filter; the pixels SP2, SP4, SP5, SP7, SP10, SP12, SP13 and SP15 may include sub-pixels having the G color filter; and the pixels SP6, SP8, SP14 and SP16 may include sub-pixels having the R color filter. In addition, each of the following groups may be arranged in the pixel array block 210a corresponding to a Bayer pattern: (i) pixels SP1, SP2 SP5 and SP6; (ii) pixels SP3, SP4, SP7 and SP8; (iii) pixels SP9, SP10, SP13, SP14; and (iv) pixels SP11, SP12, SP15 and SP16.

In other embodiments, the pixel array block 210a may include other types of color filters, such as for sensing yellow, cyan, magenta, and green colors. In another example, the color filters include filters for sensing red, green, blue, and white colors. In addition, in other embodiments, each pixel array block such as 210a may include a greater number of shared pixels.

Referring to FIG. 6B, each of the first shared pixel SP1, the second shared pixel SP2, the third shared pixel SP3, and the fourth shared pixel SP4 may include nine sub-pixels. The first shared pixel SP1 may include nine sub-pixels having the B color filter, and each of the second shared pixel SP2 and the third shared pixel SP3 may include nine sub-pixels having the G color filter. The fourth shared pixel SP4 may include nine sub-pixels having the R color filter.

As another example, referring to FIG. 6C, each of the first shared pixel SP1, the second shared pixel SP2, the third shared pixel SP3, and the fourth shared pixel SP4 may include 16 sub-pixels. In the same manner as in FIG. 6B, the first shared pixel SP1 may include 16 sub-pixels having the B color filter, and each of the second shared pixel SP2 and the third shared pixel SP3 may include 16 sub-pixels having the G color filter. The fourth shared pixel SP4 may include 16 sub-pixels having the R color filter.

Figure 7A:
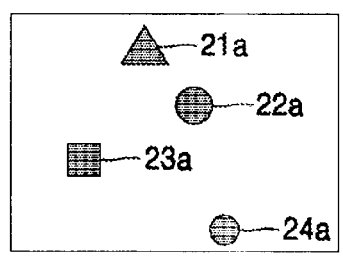
FIGS. 7A, 7B and 7C are diagrams illustrating a disparity to be described with respect to FIG. 8.
Figure 7B:
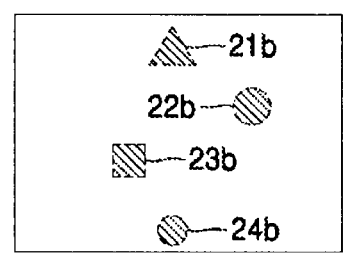
Figure 7C:
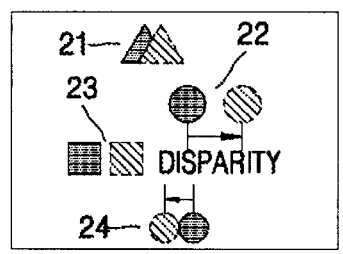
Figure 8:
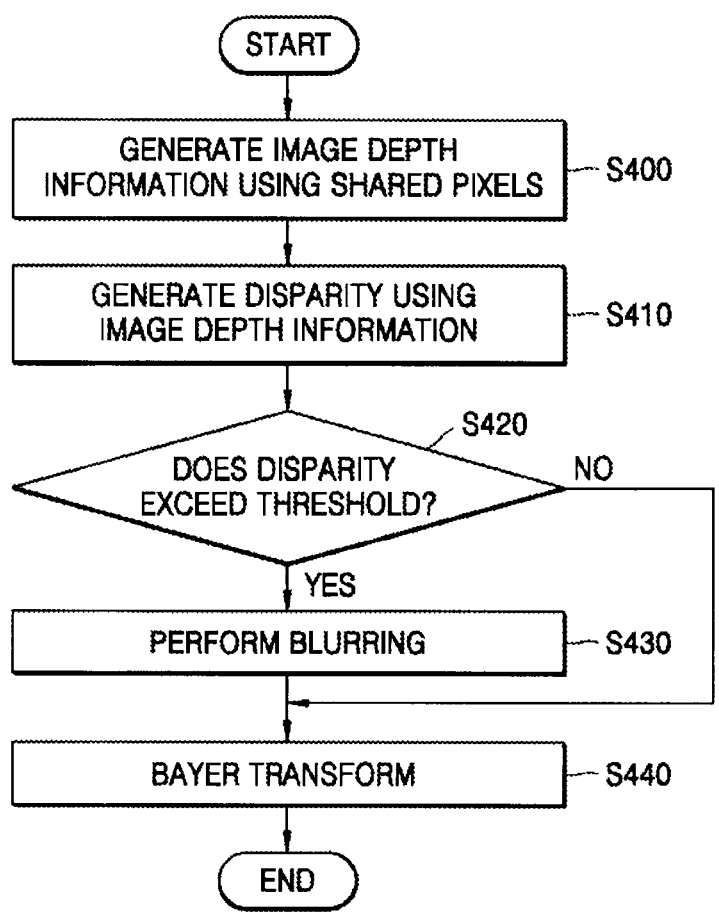
FIG. 8 is a flowchart illustrating an operating method of an imaging device in a normal mode according to an embodiment of the inventive concept.

FIGS. 7A to 7C are diagrams illustrating a disparity to be described with respect to FIG. 8. Hereinafter, the structure of the pixel array 210a of FIG. 6A is cited and described.

Referring to FIG. 7A, sub-pixels disposed on the first side, a first side image showing predetermined objects 21a to 24a detected from sub-pixels disposed on a first side such as first, third, fifth, and seventh columns Col1, Col3, Col5, and Col1 and a second side image showing predetermined objects 21b to 24b detected from sub-pixels disposed on a second side such as second, fourth, sixth, and eighth columns Col2, Col4, Col6, and Col8 are illustrated. The objects 21a to 24a of the first side image may respectively correspond to the objects 21b to 24b of the second side image.

In FIG. 7C, an example of a state in which the first side image overlaps the second side image is illustrated. The disparity with the second side image with respect to the first side image may be obtained. As an example, the disparity may be indicated by the number of shifted pixels and direction information.

Moreover, in another embodiment, an imaging device may generate the first side image showing predetermined objects detected from sub-pixels disposed in first, third, fifth, and seventh rows Row1, Row3, Row5, and Row7, a second side image showing predetermined objects detected from sub-pixels disposed in second, fourth, sixth, and eighth rows Row2, Row4, Row6, and Row8, and the disparity with the second side image with respect to the first side image may be obtained.

The first side image and the second side image for obtaining the disparity as described above may be defined as data included in image depth information, and the disparity may refer to a dynamic phase generated by a change in the distance between an object and an imaging device.

FIG. 8 is a flowchart illustrating an operating method of an imaging device in a normal mode according to an embodiment of the inventive concept.

Referring to FIG. 8, in operation S400, the imaging device may generate image depth information using shared pixels. As another embodiment, the imaging device may further include a time of flight (ToF) sensor to generate the image depth information using the ToF sensor. In operation S410, the imaging device may generate a disparity using the image depth information. In operation S420, the imaging device may determine whether the disparity exceeds a threshold. The threshold may be set in advance to determine a method used by the imaging device to process a capture image in the future. When operation S420 is Yes, the imaging device may blur the capture image in units of predetermined pixel images. Otherwise, when operation S420 is No, the imaging device may skip operation S430 and Bayer transform the capture image in operation S440. Through operation S430 or operation S440, the imaging device may correct a dynamic phase caused by a change in the distance between an object in the capture image and the imaging device.

Figure 9:
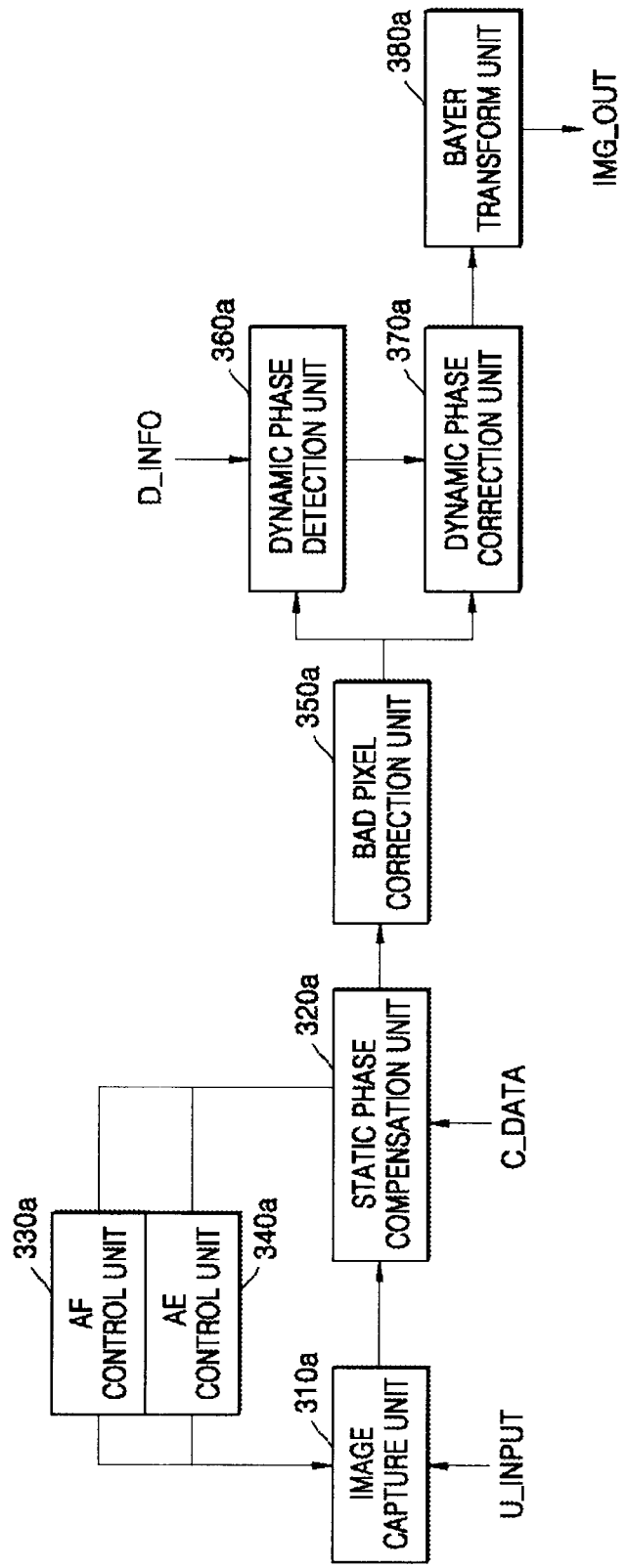
FIG. 9 is a block diagram of an imaging device illustrating an operating method in a normal mode according to an embodiment of the inventive concept.

FIG. 9 is a block diagram of an imaging device 300a illustrating an operating method in a normal mode according to an embodiment of the inventive concept.

Referring to FIG. 9, the imaging device 300a may include an image capture unit 310a, a static phase compensation unit 320a, an auto-focus (AF) control unit 330a, an auto-exposure (AE) control unit 340a, a bad pixel correction unit 350a, a dynamic phase detection unit 360a, a dynamic phase correction unit 370a, and a Bayer transform unit 380a. The image capture unit 310a may generate a capture image by receiving a user input U_INPUT and provide the capture image to the static phase compensation unit 320a. The user input U_INPUT may include light reflected from an object. The static phase compensation unit 320a may compensate for the capture image based on calibration data C_DATA. The calibration data C_DATA is data included in the static phase information described above, and may include data about a compensation gain for each shared pixel. The static phase compensation unit 320a may provide the compensated capture image or information about the compensation gain for each shared pixel to each of the AF control unit 330a and the AE control unit 340a. For example, the AF control unit 330a may control AF using the compensated capture image, and the AE control unit 340a may control AE based on the compensation gain for each shared pixel. The bad pixel correction unit 350a may perform bad pixel correction on the compensated capture image based on bad pixel information. The bad pixel information may include information indicating some shared pixels that output a deteriorated image among the shared pixels, and may be preset. The dynamic phase detection unit 360a may receive image depth information D_INFO and generate a disparity of the capture image, based on the image depth information D_INFO. The dynamic phase detection unit 360a may detect a dynamic phase in the capture image, based on the generated disparity, and provide a detection result to the dynamic phase correction unit 370a. The dynamic phase correction unit 370a may perform a blurring process on the capture image based on the detection result, and the Bayer transform unit 380a may receive the corrected capture image from the dynamic phase correction unit 370a and perform Bayer transformation to generate an output image IMG_OUT.

Figure 10A:
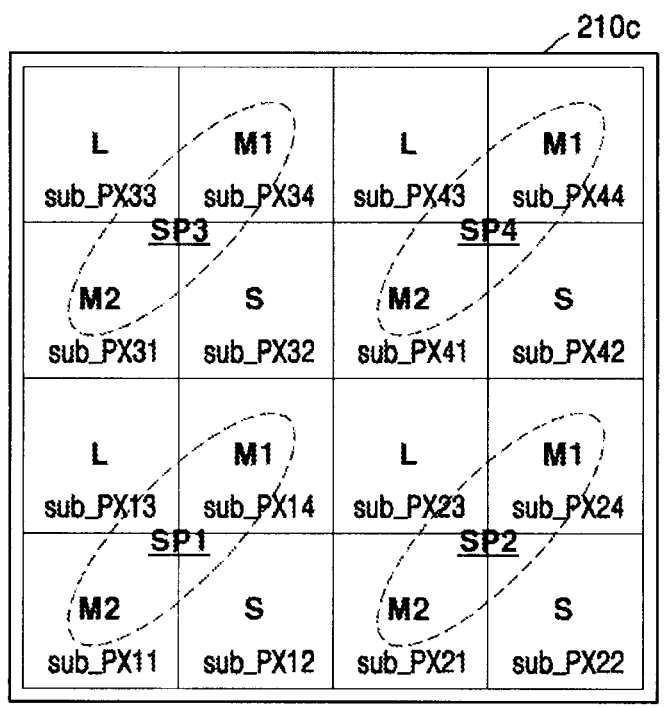
FIGS. 10A and 10B are diagrams illustrating exposure times with respect to pixel arrays in a high dynamic range (HDR) mode.
Figure 10B:
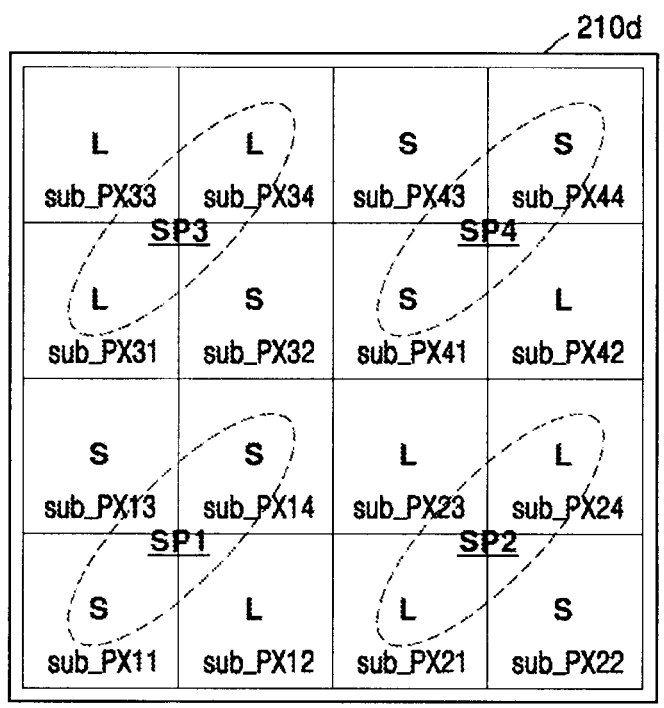

FIGS. 10A and 10B are diagrams illustrating exposure times with respect to pixel array blocks 210c and 210d of the pixel array 110 in an HDR mode.

Referring to FIG. 10A, the pixel array block 210c of the pixel array 110 may include first to fourth shared pixels SP1 to SP4, and the first to fourth shared pixels SP1 to SP4 may respectively include sub-pixels sub_PX11 to sub_PX14, sub_PX21 to sub_PX24, sub_PX31 to sub_PX34, and sub_PX41 to sub_PX44 that are controlled to have various exposure times in the HDR mode. For example, the first shared pixel SP1 may include the third sub-pixel sub_PX13 having a long exposure time ("long pattern"), the second sub-pixel sub_PX12 having a short exposure time ("short pattern"), and the first and fourth sub-pixels sub_PX11 and sub_P14 having an intermediate exposure time ("mid pattern").

Referring to FIG. 10B, the pixel array block 210d may include the first to fourth shared pixels SP1 to SP4, and the first to fourth shared pixels SP1 to SP4 may respectively include sub-pixels sub_PX11 to sub_PX14, sub_PX21 to sub_PX24, sub_PX31 to sub_PX34, and sub_PX41 to sub_PX44 that are controlled to have various exposure times in the HDR mode. For example, the first shared pixel SP1 may include the first, third, and fourth sub-pixels sub_PX11, sub_PX13, and the sub-pixel sub_PX14 having a short exposure time, and the second sub-pixel sub_PX12 having a long exposure time. The second shared pixel SP2 may include the first, third, and fourth sub-pixels sub_PX21, sub_PX23, and sub_PX24 having a long exposure time, and the second sub-pixel sub_PX22 having a short exposure time.

It is noted here that other schemes for exposure time control in the HDR mode which differ from those illustrated in FIGS. 10A and 10B may be applied in other embodiments for increasing a dynamic range.

Hereinafter, an operating method of an imaging device in an HDR mode will be described on the assumption of the example of FIG. 10A.

FIG. 11 is a flowchart illustrating an operating method of an imaging device in an HDR mode according to an embodiment of the inventive concept.

Referring to FIG. 11, in operation S500, the imaging device may control exposure time differently with respect to sub-pixels in a shared pixel. For example, the imaging device may control sub-pixels within one shared pixel (which is a commonly shared pixel) to have various exposure times as in FIG. 10A. In operation S510, the imaging device may split a capture image generated through operation S500 into pixel images for each exposure time. For example, the imaging device may split the capture image into a pixel image corresponding to a long exposure time, a pixel image corresponding to a short exposure time, and a pixel image corresponding to an intermediate exposure time. In operation S520, the imaging device may generate brightness difference information using a reference exposure time (interchangeably, "reference pattern") in the shared pixel. For instance, the imaging device may generate the brightness difference information by comparing the brightness of a split image corresponding to a reference exposure time and a reference brightness. Moreover, the reference exposure time may be set as an intermediate exposure time) of FIG. 10A, or a long exposure time ("long pattern") or a short exposure time ("short pattern") of FIG. 10B. The reference brightness may be preset as the brightness of an ideal pixel image generated through sub-pixels having the reference exposure time. In operation S530, the image device may determine whether a disparity based on the brightness difference information exceeds a threshold. The threshold may be set in advance to determine a method performed by the imaging device to process the capture image in the future. When operation S530 is Yes, the imaging device may correct the capture image considering a local motion. The local motion may mean the motion of a detected object. Specifically, the imaging device may generate a first weight, based on the difference between the brightness of the pixel image generated from the sub-pixels corresponding to the reference pattern and the reference brightness, and correct the capture image by applying the first weight to a pixel image generated from sub-pixels corresponding to a different pattern (e.g., the long pattern or the short pattern). Otherwise, when operation S530 is No, the imaging device may follow operation S540, where the imaging device may detect a shared pixel having the smallest difference between the brightness of the pixel image generated from sub-pixels corresponding to the reference pattern among the plurality of shared pixels and the reference brightness. Then, a second weight may be generated based on a difference between the brightness of the pixel image generated from sub-pixels corresponding to the reference pattern in the detected shared pixel and the reference brightness. The capture image may be corrected by applying the second weight to the pixel image generated from sub-pixels corresponding to a different pattern (e.g., the long pattern or the short pattern). Lastly, the phase of the captured image may be corrected in operation S550.

Figure 12:
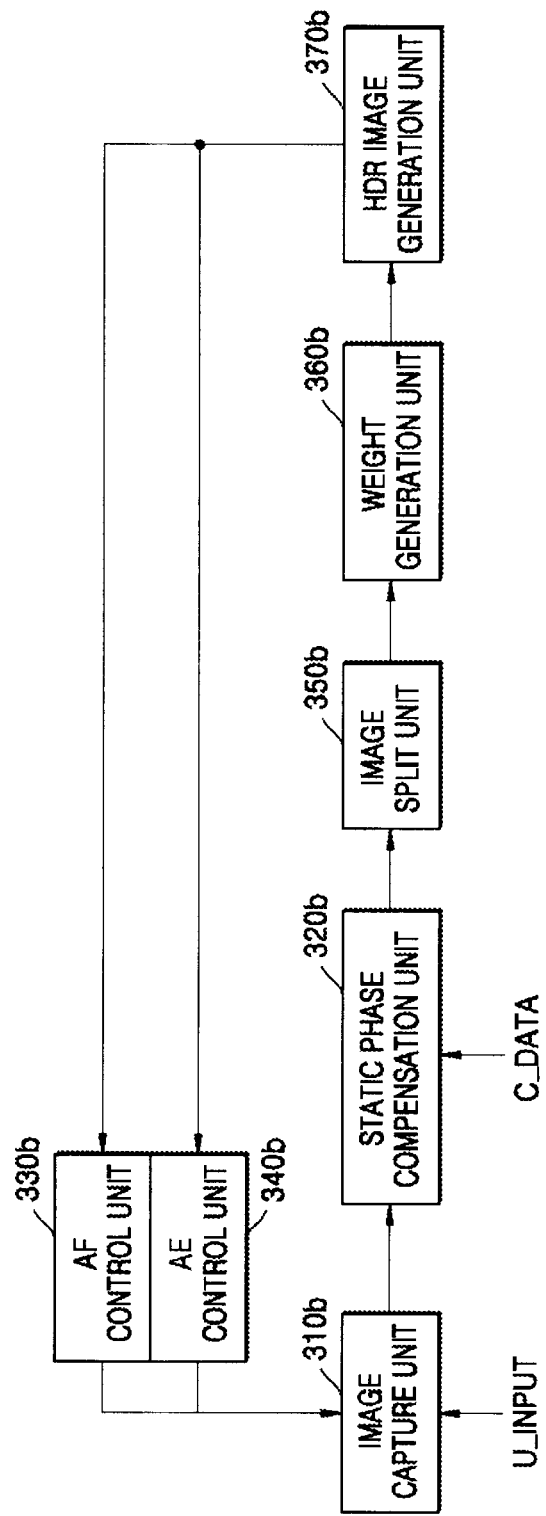
FIG. 12 is a block diagram of an imaging device illustrating an operating method in an HDR mode according to an embodiment of the inventive concept.

FIG. 12 is a block diagram of an imaging device 300b illustrating an operating method in an HDR mode according to an embodiment of the inventive concept.

Referring to FIG. 12, the imaging device 300b may include an image capture unit 310b, a static phase compensation unit 320b, an AF control unit 330b, an AE control unit 340b, an image split unit 350b, a weight generation unit 360b, and an HDR image generation unit 370b. The image capture unit 310b may generate a capture image by receiving the user input U_INPUT and provide the capture image to the static phase compensation unit 320b. The static phase compensation unit 320b may compensate for the static phase of the capture image based on calibration data C_DATA. The image split unit 350b may generate a plurality of pixel images split for each exposure time from the compensated capture image. The weight generation unit 360b may generate weights by comparing the brightness of pixel images corresponding to a reference pattern to a reference brightness. For example, the weight generation unit 360b may generate a first weight based on a difference between the brightness of a pixel image generated from sub-pixels corresponding to the reference pattern and the reference brightness. In addition, the weight generation unit 360b may detect a shared pixel having the smallest difference between the brightness of the pixel image generated from sub-pixels corresponding to the reference pattern among a plurality of shared pixels and the reference brightness and generate a second weight based on a difference between the brightness of the pixel image generated from sub-pixels corresponding to the reference pattern in the detected shared pixel and the reference brightness. The HDR image generation unit 370b may correct a phase difference in the capture image according to a local motion by applying the generated first weight and second weight to pixel images corresponding to a pattern other than the reference pattern, or generate (or reconstruct) an HDR image by correcting a phase difference in the capture image caused by another factor. The AF control unit 330b and the AE control unit 340b may receive an HDR image and perform AF control and AE control using the HDR image, respectively.

Figure 13:
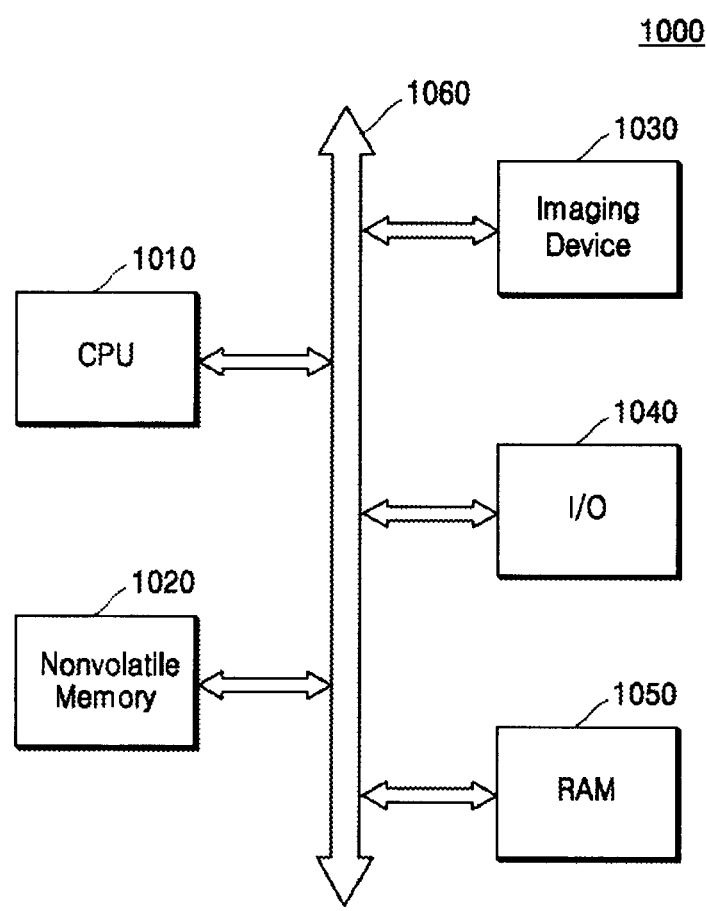
FIG. 13 is a block diagram illustrating a system including an imaging device according to an embodiment of the inventive concept.

FIG. 13 is a block diagram illustrating a system 1000 including an imaging device 1030 according to an embodiment of the inventive concept.

The system 1000 of FIG. 13 may include a computer system, a camera system, a scanner, a vehicle navigation, a video phone, a security system, and a motion detection system that require image data. The system 1000 may include a central processing unit or processor 1010, a nonvolatile memory 1020, the imaging device 1030 including an image sensor, an input/output device 1040, and RAM 1050. The central processing unit 1010 may communicate with the nonvolatile memory 1020, the imaging device 1030, the input/output device 1040, and the RAM 1050 through a bus 1060.

The imaging device 1030 included in the system 1000 may perform an operation for compensating for a static phase in a capture image due to misalignment with each micro lens of shared pixels according to embodiments of the inventive concept, and adaptively perform a processing operation of the capture image according to an operation mode.

The image data output from the imaging device 1030 may be transferred to the central processing unit 1010, the nonvolatile memory 1020, the input/output device 1040, and the RAM 1050 through the bus 1060. The imaging device 1030 according to embodiments of the inventive concept may provide an improved image having good image quality and a wide dynamic range.

Figure 14:
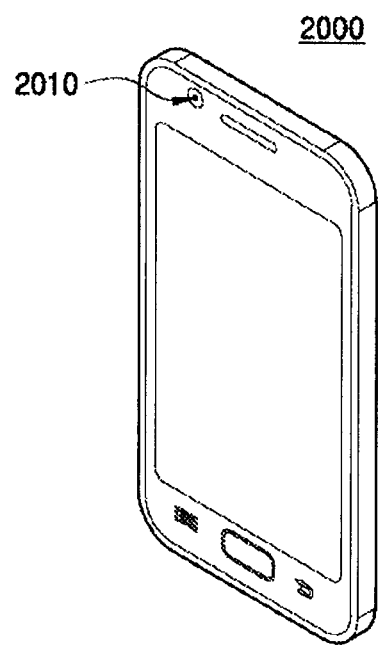
FIG. 14 is a perspective view illustrating an electronic device including an imaging device according to embodiments of the inventive concept.

FIG. 14 is a perspective view illustrating an electronic device including an imaging device 2010 according to embodiments of the inventive concept.

Referring to FIG. 14, the imaging device 2010 according to embodiments of the inventive concept may be provided in a mobile phone 2000. In addition, the imaging device 2010 may be included in the electronic device such as a camera, a camcorder, a personal digital assistant (PDA), a wireless phone, a laptop computer, an optical mouse, a fax machine, a copying machine, etc. In addition, the imaging device 2010 according to embodiments of the inventive concept may be provided in a device such as a telescope, a mobile phone handset, a scanner, an endoscope, a fingerprint recognition device, a toy, a game machine, a home robot, a vehicle, etc.

Herein, the term "circuitry", "circuit" or the like may be substituted for the word "unit" or "module", when "unit" or "module" is used as part of a name for a component that includes circuitry to perform its described function. Thus, for example, the signal processing unit 130, static phase compensation module 132, AF control unit 330a or 330b, AE control unit 340a or 340b, image capture unit 310a or 310b, static phase compensation unit 320a or 320b, bad pixel correction unit 350a, dynamic phase detection unit 360a, dynamic phase correction unit 370a, bayer transform unit 380a, image split unit 350b, weight generation unit 360b and HDR image generation unit 370b may be alternatively called a signal processing circuit/circuitry 130, static phase compensation circuitry 132, AF control circuit or circuitry 330a or 330b, HDR image generation circuit/circuitry 370b, respectively. Further, each of these components may include or may be implemented by processing circuitry/control circuitry that may execute instructions read from a non-transitory memory (e.g. memories 1020 and/or 1050) within the imaging device to perform their respective functionality described herein.

While the inventive concept has been particularly shown and described with reference to embodiments thereof, it will be understood that various changes in form and details may be made therein without departing from the spirit and scope of the following claims.

What is claimed is:

1. An image sensor comprising:
a pixel array comprising a plurality of shared pixels that share a floating diffusion node, each of the shared pixels comprising sub-pixels covered by one microlens, and receive light reflected from an object;
a memory storing shift information of a micro lens of each of the plurality of shared pixels; and
an image processing unit configured to compensate for a capture image generated from the plurality of shared pixels using the shift information and generate a compensated capture image,
wherein the plurality of shared pixels are configured such that exposure time is controlled based on a degree of an image brightness change associated with the compensation of the capture image.

2. The image sensor of claim 1, wherein:
the shift information corresponds to a degree of misalignment of the micro lens of each of the plurality of shared pixels, and
the shift information comprises an X-axis shift degree and a Y-axis shift degree on the micro lens placed on each of the plurality of shared pixels.

3. The image sensor of claim 2, wherein the X-axis shift degree has a same value as the Y-axis shift degree.

4. The image sensor of claim 2, wherein the X-axis shift degree has a different value from the Y-axis shift degree.

5. The image sensor of claim 1, further comprises:
a timing controller configured to perform an automatic exposure operation on the plurality of shared pixels in response to a control signal based on brightness difference information.

6. The image sensor of claim 1, wherein the image processing unit is configured to apply a compensation gain for each of the plurality of shared pixels to the capture image based on the shift information and generate the compensated capture image.

7. The image sensor of claim 1, wherein the image processing unit is configured to correct the compensated capture image adaptively according to a selected mode from among a normal mode and a high dynamic range (HDR) mode.

8. An image sensor comprising:
a pixel array comprising a plurality of shared pixels that share a floating diffusion node, each of the shared pixels comprising sub-pixels covered by one microlens, and receive light reflected from an object;
a memory storing static phase information based on a degree of misalignment of a micro lens of each of the plurality of shared pixels; and
an image processing unit configured to compensate fox a capture image generated from the plurality of shared pixels using the static phase information to generate a compensated capture image, and correct the compensated capture image adaptively according to a selected mode among a plurality of selectable modes.

9. The image sensor of claim 8, wherein the selected mode corresponds to one of a normal mode in which a first exposure time of a plurality of subpixels included in each of the plurality of shared pixels is equally controlled, and a high dynamic range (HDR) mode in which a second exposure time of the plurality of subpixels is controlled to have at least two patterns.

10. The image sensor of claim 9, wherein the image processing unit, when the selected mode is the normal mode, is configured to detect a dynamic phase generated by a change in a distance between the object and the image sensor and correct the compensated capture image based on the detected dynamic phase.

11. The image sensor of claim 9, wherein the image processing unit, when the selected mode is the HDR mode, is configured to generate weight information based on a difference between a reference brightness and a brightness of a pixel image generated from subpixels corresponding to a reference pattern among the at least two patterns, and corrects the compensated capture image based on the weight information.

12. The image sensor of claim 9, wherein the at least two patterns comprise a long pattern, a short pattern, and a mid pattern, and wherein the mid pattern is applied as a reference pattern to at least two sub-pixels among the sub-pixels in the plurality of shared pixels.

13. The image sensor of claim 8, wherein the plurality of shared pixels are configured such that exposure time is controlled based on brightness difference information associated with compensation for the capture image.

14. The image sensor of claim 8, further comprises:
a timing controller configured to perform an automatic exposure operation on the plurality of shared pixels in response to a control signal based on brightness difference information.

15. An operating method of an image sensor comprising a plurality of shared pixels that share a floating diffusion node, and each comprising sub-pixels covered by a microlens, the operating method comprising:
generating a capture image from the plurality of shared pixels that receive light reflected from an object;
compensating the capture image using static phase information, which is based on a misalignment of a micro lens of each of the plurality of shared pixels; and
exposing the plurality of shared pixels in response to a control signal based on a degree of an image brightness change associated with the compensation of the capture image.

16. The operating method of claim 15, wherein the compensating the capture image comprises:
applying compensation gain for each of the plurality of shared pixels to the capture image.

17. The operating method of claim 15, further comprises:
adaptively correcting the compensated captured image according to a selected mode.

18. The operating method of claim 17, wherein the selected mode corresponds to one of a normal mode in which first exposure time of a plurality of subpixels included in each of the plurality of shared pixels is equally controlled, and a high dynamic range (HDR) mode in which second exposure time of the plurality of subpixels is controlled to have at least two patterns.

19. The operating method of claim 17, wherein the brightness difference information is also associated with correction of the compensated capture image.

20. The image sensor of claim 8, wherein the selected mode is a mode in which disparity of the compensated capture image associated with depth information is generated.

* * * * *